(12) United States Patent
Chiang et al.

(10) Patent No.: US 6,350,127 B1
(45) Date of Patent: Feb. 26, 2002

(54) METHOD OF MANUFACTURING FOR CMOS IMAGE SENSOR

(75) Inventors: An-Min Chiang, Hsin-Chu; Chi-Hsiang Lee, Hua-Lien; Wei-Kun Yeh, Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/439,355

(22) Filed: Nov. 15, 1999

(51) Int. Cl.[7] ............................................... H01L 21/00
(52) U.S. Cl. .......................... 434/48; 438/59; 438/305
(58) Field of Search ........................... 438/202, 75, 48, 438/231, 232, 305, 306, 57, 59, 73

(56) References Cited

U.S. PATENT DOCUMENTS

| | | | |
|---|---|---|---|
| 4,473,836 A | * | 9/1984 | Chamberlain |
| 5,461,425 A | | 10/1995 | Fowler et al. ............... 348/294 |
| 5,466,612 A | | 11/1995 | Fuse et al. |
| 5,614,744 A | | 3/1997 | Merrill ......................... 257/291 |
| 5,625,210 A | | 4/1997 | Lee et al. ..................... 257/292 |
| 5,854,100 A | | 12/1998 | Chi |
| 6,118,142 A | * | 9/2000 | Chen et al. .................. 257/232 |
| 6,207,984 B1 | * | 3/2001 | Chang ......................... 257/291 |

* cited by examiner

Primary Examiner—Tuan H. Nguyen
(74) Attorney, Agent, or Firm—George O. Saile; Stephen B. Ackerman

(57) ABSTRACT

A method of forming an image sensor is disclosed. A partially processed semiconductor wafer is provide, containing p-type and/or n-type regions which are bounded by isolation regions and with gate oxide layers grown on the surfaces upon which gate electrode structures are disposed, some of said gate electrode structures will serve as gate electrodes of image sensor transistors. Ions are implanted to form source/drain structures about the said gate electrode structures, with an extended region for source drains bordering photodiode regions. Ions are implanted to form photodiodes, overlapping the extended bordering source drain regions. A blanket transparent insulating layer is deposited.

30 Claims, 1 Drawing Sheet

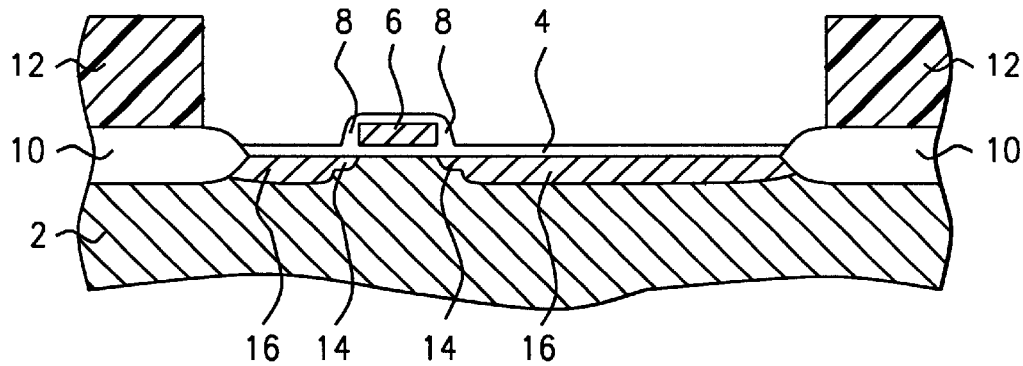
FIG. 1 – Prior Art
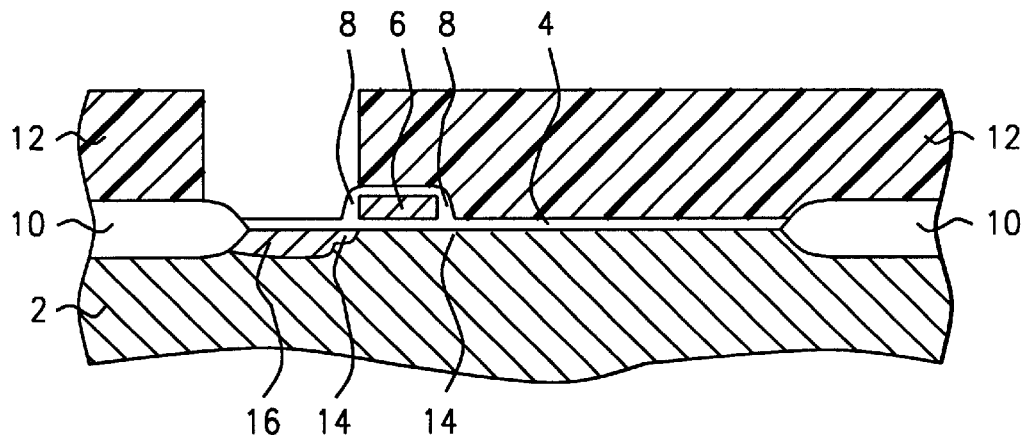
FIG. 2
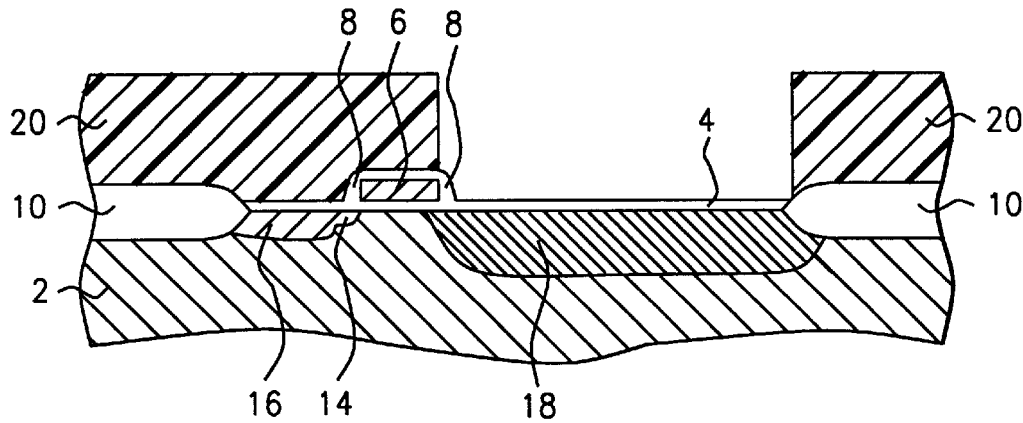
FIG. 3

METHOD OF MANUFACTURING FOR CMOS IMAGE SENSOR

BACKGROUND OF THE INVENTION (1) Field of the Invention

The present invention relates generally to image sensing devices and more particularly to methods of fabrication of such devices.

(2) Description of Prior Art

Image sensors are utilized extensively in modern technology. U.S. Pat. No. 5,854,100 to Chi shows a method of forming a new bipolar/CMOS pixel for high-resolution imagers. The active pixci sensor has a photodiode, a bipolar transistor and a MOS transistor, is immune to image blooming and reduces image lag. U.S. Pat. No. 5,625,210 to Lee et al. shows a method to utilize CMOS and CCD technologies to achieve a pinned photodiode integrated into the image-sensing element of an active pixel sensor. Merrill in U.S. Patent No. 5,614,744 discloses a CMOS based low leakage array with anti-blooming isolation. (Guard rings and/or protective diffusions are utilized to isolate the image-sensing array from electrons generated at the periphery of the active area. U.S. Pat. No. 5,466,612 to Fuse et al. teaches a method of manufacturing a solid-state image-sensing device. Low leakage current in the photodiode is achieved by the addition of a shallow fluorine implant through an oxide layer. A CMOS image sensor with pixel level A/D conversion is shown in U.S. No. Pat. 5,461,425 to Fowler et al. Light induced analog signals generated by phototransistors are converted to serial bit streams by A/D converters connected at the output of each phototransistor.

Conventional image sensing devices often utilize junction photodiodes as the photosensitive device. The ion implants required to form these junction photodiodes are performed simultaneously with the source drain implants of the adjacent FET and the photodiode implants are extensions of source I drain regions. This is shown in FIG. 1 Prior Art for a lightly doped drain (LLD) n-channel FET (NFET). Region 4 is a gate oxide grown over the surface of a p-well. A polysilicon gate electrode, 6, is formed and a first, lower dose, implant is self-aligned to the gate electrode to achieve an n-region, 14, below the gate oxide extending to the field oxide, 10. An implant mask, 12, which could be photoresist, is disposed over the field oxide. Oxide spacers, 8, are then formed and a second, higher dose, implant is self-aligned to the oxide spacers. An n+region, 16, is thus achieved, disposed under the n-region, separated from the gate electrode by about the thickness of the oxide spacer and extending to the field oxide. The n region of the junction photodiode thus formed is an extension of the FET drain. The characteristics of the implants forming this region, chosen to optimize the FET performance, are not likely to optimize the performance of the junction photodiode.

SUMMARY OF THE INVENTION

Accordingly, it is a primary objective of the invention to provide a method of forming a CMOS image sensor that permits optimization of both the photodiode and the FET. This objective is achieved by using an extra mask for the ion implantation of the photodiode and adjusting the implantation characteristics specifically to attain desired photodiode properties. The specie, energy and dose of the implantation determine the depth of the photodiode junction. Ability to vary the depth allows for control of the relative response of the photodiode to the wavelength of the incident light. Furthermore, sources of photodiode leakage generally accumulate near surfaces and edges and by providing a sufficiently deep junction these sources of leakage can be avoided.

In a preferred embodiment of the invention a partially processed n-type semiconductor substrate is provided in which a p-well or p-substrate has been formed. The surface of the p-well or p-substrate consists of a region of gate oxide bounded by field oxide. A conductive gate structure is disposed asymmetrically on the gate oxide, On one side a source/drain region can be accommodated under the gate oxide in an area bounded by the gate and the field oxide, On the other side, the area bounded by the gate and the field oxide can also accommodate a photodiode between a source/drain region and the field oxide, with some overlap of the photodiode and source/drain region. Using a mask that is open only over the gate, the source/drain regions and the overlap region, a shallow, low dose, donor ion implantation is performed. Insulating spacers are then applied to the gate sidewalls by depositing an insulating layer and etching this layer with an anisotropic etch. Again using a mask that is open only over the gate, the source/drain regions and the overlap region, a deeper, higher dose, donor ion implantation is performed. Next, the photodiode implant is performed using a mask open only over the photodiode area and the area of overlap of the photodiode and source/drain. This donor implant is deeper than the source/drain implants. A transparent insulating layer is now deposited.

Lightly doped drain structures for PMOS transistors on the substrate are achieved by first performing a shallow, low dose, acceptor ion implant. Insulating spacers on the gate are then fabricated concurrent with the insulating spacers of the NMOS transistors, including those of the image sensor. A deeper, higher dose, acceptor ion implant follows which is done before deposition of the transparent insulating layer.

A method of forming an image sensor is disclosed. A partially processed semiconductor wafer is provide, containing p-type and/or n-type regions which are bounded by isolation regions and with gate oxide layers grown on the surfaces upon which gate electrode structures are disposed, some of said gate electrode structures will serve as gate electrodes of image sensor transistors. Ions are implanted to form source/drain structures about the said gate electrode structures, with an extended region for source drains bordering photodiode regions. Ions are implanted to form photodiodes, overlapping the extended bordering source drain regions. A blanket transparent insulating layer is deposited.

BRIEF DESCRIPTION OF THE DRAWINGS

In the accompanying drawings, forming a material part of this description, there is shown:

FIG. 1 Prior Art shows the layout and implant mask of a conventional CMOS image sensor.

FIG. 2 shows source/drain implant mask according to a preferred embodiment of the invention.

FIG. 3 shows photodiode and overlap implant mask.

DESCRIPTION OF THE PREFERRED EMBODIMENTS

General principles of preferred embodiments of the invention are illustrated in FIGS. 2 and 3. Referring to FIG. 2 there is shown a portion of a partially processed semiconductor wafer.

Region 2 is a p-well or p-substrate formed in an n-type semiconductor. Usually the semiconductor and p-well are silicon. A gate oxide layer, 4, is formed on the surface of the p-well or p-substrate and this layer is bounded by an isolation region, such as a field oxide, 10. Techniques for forming the gate oxide layer and isolation region are well known to those skilled in the art. Next a conductive gate electrode, 6, is formed; preferably of polysilicon or polycide, about 0.35 to 1.0 micrometers wide and about 0.13 to 0.4 micrometers high. Procedures for forming conductive gate electrodes are well known to those skilled in the art. A source/drain implant mask, 12, preferably of photoresist, is then used to fabricate the source/drain regions. The opening starts just beyond the edge of the field oxide on the side closer to the gate electrode and extends, on the opposite side, from the edge of the gate electrode to the field oxide edge. The first of the LDD implants is then performed, resulting in a shallow, lightly doped n-type region, 14, self-aligned to the gate electrode and extending somewhat beyond the boundaries of the gate electrode and the mask opening. This is normally a phosphorus implant with a dose of about 1P13 to 1E14 per cm2 and at energy of about 40 to 70 keV.

To complete the LDD structure, insulating spacers, 8, are required at the edges of the gate electrode. As is well known to those skilled in the art, the spacers are formed by depositing an insulating layer to a thickness of about that of the gate electrode and then etching it with an anisotropic reactive ion etch. This results in a spacer width at the gate oxide surface of between about 75% to about 85% of the insulating layer thickness. In a preferred embodiment of the invention the insulating layer is composed of TEOS. The purpose of the LDD structure is to alleviate problems associated with hot electron effects. After the spacers are formed, the second implant, which is deeper and of a higher dose, is performed using the same source/drain implant mask as in the first implant. A n+region, 16, results that is self-aligned to the insulating spacers, extending somewhat under the spacers and somewhat beyond the implant mask boundary. Typically the second source/drain implant is arsenic with a dose of 1E55 to 5E15 per cm2 at an energy of between about 35 to 65 keV.

At this stage a photodiode implant mask, region 20 of FIG. 3, is used to fabricate the photodiode. The photodiode implant mask preferably consists of photoresist. As indicated in the figure the mask opening overlaps the source drain region and extends somewhat beyond the edge of the field oxide. An implant is now to be chosen to optimize the operation of the photodiode. One consideration in making this choice is that proximity of the photodiode junction to the surface and to the bird's beaks of the field oxide isolation often leads to a reduced performance, Recombination times near the surface and bird's beak are generally shorter tan in the bulk. Thus carriers generated near the surface or bird's beak, yet within a bulk diffusion length of the depletion region, will more likely recombine before being swept out through the depletion region than bulk carriers. This reduces the photocurrent. In addition, defects have a tendency to accumulate near surfaces and could give rise to increased leakage current even to the extent that the pixel is inoperative. Proximity to the surface or bird's beak can reduce the sensitivity of the image sensor and even diminish the yield. There is therefor an advantage of a relatively deep photodiode implant, as is indicated by region 18 of FIG. 3. High sensitivity image sensors with substantial improvements in yield and leakage over conventional photodiodes are achieved with a phosphorus photodiode implant to a dose of between 1E13 to 5E15 per cm2 and with energy of between 40 and 120 keV. The increased energy of the photodiode implant deepens the photodiode junction so that the increased recombination and defect density near the surface do not affect its operation. This deeper photodiode implant is made possible by the added photodiode implant mask.

There is another advantage to the ability of controlling the photodiode implant without impacting the source/drain implant. This relates to the current generation efficiency of photons of different wavelengths. At optical wavelengths photon absorption takes place through the creation of electron-hole pairs and the absorption coefficient determines the probability that this occurs. The absorption coefficient is a strongly decreasing function of wavelength. There is a wavelength range in which appreciable photocurrent can be generated. A long-wavelength cutoff exists at the wavelength associated with the semiconductor bandgap, 1.1 micrometers for silicon; photons of larger wavelengths do not create electron-hole pairs and thus do not contribute to the photocurrent. A short wave length cutoff also occurs. For sufficiently short wavelengths the absorption coefficient is so large that essentially all electron-hole pairs are created so close to the surface, where the recombination rate is large, that they therefor cannot escape and reach the depletion region to be swept across it. The short wavelength cutoff increases to longer wavelengths for deeper junctions. When the depth of the depletion region is greater than about the bulk minority carrier diffusion length, the photon current generation efficiency decreases with increasing depth at all wave lengths; but in such a way as to favor long wave lengths. Thus the flexibility of adjusting the junction depth, gained by using an additional photodiode implant mask, gives rise to the ability to adjust the image sensor wavelength response.

Referring again to FIG. 3, there is shown the photodiode mask 20. As shown in FIG. 3, its opening extends from just beyond the edge of the field oxide bordering the photodiode to the gate electrode. After the photodiode implant the next step is to deposit a transparent insulating layer, which in a preferred embodiment of the invention can be BPTEOS, LPTEOS or PEoxide. Procedures for depositing the transparent insulating layer are well known to those skilled in the art.

In other embodiments of this invention photodiodes could be formed by an acceptor implant into an n-type region through a photodiode implant mask and these image sensors will contain PMOS transistors.

While the invention has been particularly shown and described with reference to the preferred embodiments thereof, it will be understood by those skilled in the art that various changes in form and detail may be made without departing from the spirit and scope of the invention.

What is claimed is:

1. A method of forming an image sensor comprising:
   providing a partially processed semiconductor wafer containing p-type and/or n-type semiconductor regions which are bounded by isolation regions and which contain gate oxide layers grown on the surfaces upon which gate electrode structures are disposed, some of said gate electrode structures will serve as gate electrodes of image sensor transistors;
   implanting tons only to form source/drain structures only on one side of said gate electrode structures, then implanting ions only to form photodiodes on the other side of said gate electrode structures, which can also be source/drain structures;
   depositing a blanket transparent insulating layer.
2. The method of claim 1 wherein said gate electrode structures are composed of polysilicon or polycide.

3. The method of claim 1 wherein the isolation region is composed of field oxide.

4. The methods of claim 1 wherein the semiconductor region is p-type and the ions implanted to form the source/drain regions are donors.

5. The method of claim 1 wherein the semiconductor region is p-type silicon and the source/drain implant ions are arsenic and/or phosphorus.

6. The methods of claim 1 wherein the semiconductor region is n-type and the ions implanted to form the source/drain regions are acceptors.

7. The method of claim 1 wherein the semiconductor region is n-type silicon and the source/drain implant ions are boron and/or fluorine.

8. The method of claim 1 wherein the source/drain implant is accomplished in two stages; the first, providing regions near the gate that are lightly doped and the second, highly doped regions for low resistance.

9. The method of claim 1 wherein the semiconductor region is p-type silicon and the source/drain implant is accomplished in two stages; the first being phosphorus to a dose of about 1E13 to 1E14 per cm2 at an energy of 40 to 70 keV and the second being arsenic to a dose of about 1E15 to 5E15 per cm2 at an energy of 35 to 65 keV.

10. The method of claim 1 wherein the semiconductor region is n-type silicon and the source/drain implant is accomplished in two stages; the first being BF2 to a dose of about 8E12 to 5E13 per cm2 at an energy of 30 to 50 keV and the second being BF2 to a dose of about 1E15 to 5E15 per cm2 at an energy 30 to 50 keV.

11. The method of claim 1 wherein the width of the gate electrode is between 0.35 to 1.0 micrometers.

12. Tile method of claim 1 wherein the width of said source/drain side is between 0.35 to 1.0 micrometers.

13. The method of claim 1 wherein We semiconductor region is p-type and the photodiode implant ions are donors.

14. The method of claim 1 wherein the semiconductor region is p-type silicon and the photodiode implant ions are phosphorus to a dose of about 1E13 to 5E15 per cm2 at an energy of 40 to 120 keV.

15. The method of claim 1 where in said blanket insulating layer is TEOS or BPTOES PEoxide.

16. A method of forming an image sensor comprising:

providing a partially processed semiconductor wafer containing p-type and/or n-type semiconductor regions which are bounded by isolation regions and which contain gate oxide layers grown on the -surfaces upon which gate electrode structures are disposed, some of said gate electrode structures will serve as gate electrodes of image sensor transistors;

implanting ions only to form LDD source/drain structures only on one side of said gate electrode structures, then implanting ions only to form photodiodes on the other side of said gate electrode structures, which can also be source/drain structures:

depositing a blanket transparent insulating layer.

17. The method of claim 16 wherein said gate electrode structures are composed of polysilicon or polycide.

18. The method of claim 16 wherein the isolation region is composed of field oxide.

19. The methods of claim 16 wherein the semiconductor region is p-type and the ions implanted to form the LDD source/drain regions are donors.

20. The method of claim 16 wherein the semiconductor region is p-type silicon and the LDD) source/drain implant ions are arsenic and phosphorus.

21. The methods of claim 16 wherein the semiconductor region is n-type and the ions implanted to form the source/drain regions are acceptors.

22. The method of claim 16 wherein the semiconductor region is n-type silicon and the source/drain implant ions are boron and fluorine.

23. The method of claim 16 wherein the source/drain implant is accomplished in two stages; the first, providing regions near the gate that are lightly doped and the second, highly doped regions for low resistance, Insulating spacers, who can be TEOS, are formed between the two implant stages.

24. The method of claim 16 wherein the semiconductor region is p-type silicon and the source/drain implant is accomplished in two stages; the first being phosphorus to a dose of about 1E13 to 1E14 per cm2 at an energy of 40 to 70 keV and the second being arsenic to a dose of about 1F15 to 5E15 per cm2 at an energy of 35 to 65 keV.

25. The method of claim 16 wherein the semiconductor region is n-type silicon and the source/drain implant is accomplished in two stages; the first being BF2 to a dose of about 8E12 to 5E13 per cm2 at an energy of 30 to 50 keV and the second being BF2 to a dose of about 1E15 to 5E15 per cm2 at an energy 30 to 50 keV.

26. The method of claim 16 wherein the width of the gate electrode is between 0.35 to 1.0 micrometers.

27. The method of claim 16 wherein the width of said source/drain side is between 0.35 to 1.0 micrometers.

28. The method of claim 16 wherein the semiconductor region is p-type and the photodiode implant ions are donors.

29. The method of claim 16 wherein the semiconductor region is p-type silicon and the photodiode implant ions are phosphorus to a dose of about 1E13 to 5E15 per cm2 at an energy of 40 to 120 keV.

30. The method of claim 16 wherein said blanket insulating layer is TEOS or BPTEOS.

* * * * *